United States Patent
Yan et al.

(10) Patent No.: US 9,590,371 B2
(45) Date of Patent: Mar. 7, 2017

(54) ASSEMBLIES FOR SELECTABLE MOUNTING OF POWER INPUT CABLES AND RELATED SYSTEMS AND METHODS

(71) Applicant: Eaton Corporation, Cleveland, OH (US)

(72) Inventors: Jun Yan, Cary, NC (US); Scott Jason Davis, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 56 days.

(21) Appl. No.: 14/230,514

(22) Filed: Mar. 31, 2014

(65) Prior Publication Data
US 2015/0280379 A1  Oct. 1, 2015

(51) Int. Cl.
| | | |
|---|---|---|
| H01R 33/00 | (2006.01) | |
| H01R 27/00 | (2006.01) | |
| H05K 7/14 | (2006.01) | |
| H01R 31/02 | (2006.01) | |
| H01R 13/627 | (2006.01) | |

(52) U.S. Cl.
CPC ............ H01R 27/00 (2013.01); H01R 31/02 (2013.01); H05K 7/1457 (2013.01); H01R 13/6273 (2013.01); Y10T 29/49169 (2015.01)

(58) Field of Classification Search
CPC ......... H01R 4/32; H01R 31/02; H01R 25/003
USPC ........ 439/652, 654, 650, 651, 218, 653, 370
See application file for complete search history.

(56) References Cited

U.S. PATENT DOCUMENTS

| 5,334,033 A | * | 8/1994 | Milan | ................ H01R 13/6666 439/214 |
| 6,086,397 A | * | 7/2000 | Chapman | ............. H01R 25/003 439/214 |
| 6,500,025 B1 | * | 12/2002 | Moenkhaus | ........... H01R 27/00 439/218 |

(Continued)

FOREIGN PATENT DOCUMENTS

| DE | 202011108964 | | 3/2012 | |
| EP | 1139512 | | 10/2001 | |
| GB | 2468495 | * | 9/2010 | ........... H01R 13/514 |

OTHER PUBLICATIONS

International Search Report and Written Opinion for PCT/IB2015/052165, mailed Jun. 18, 2015, 10 pages.

(Continued)

*Primary Examiner* — Abdullah Riyami
*Assistant Examiner* — Thang Nguyen
(74) *Attorney, Agent, or Firm* — Myers Bigel, P.A.

(57) ABSTRACT

An electrical device assembly includes an electrical device and a power input member. The electrical device includes an end portion having a cavity with a mounting surface at a distal portion of the cavity. The power input member includes a body and a power input cable extending from the body. The body has a plurality of faces including first and second mounting faces. The cavity is sized and configured to receive the power input member body: in a first position with the first mounting face facing the mounting surface and with the power input cable extending away from the electrical device in a first direction; and in a second position with the second mounting face facing the mounting surface and with the power input cable extending away from the electrical device in a second direction that is different from the first direction.

20 Claims, 8 Drawing Sheets

(56) References Cited

U.S. PATENT DOCUMENTS

| | | | |
|---|---|---|---|
| 7,371,122 B2* | 5/2008 | Ivanova | H01R 9/2408 439/652 |
| 7,442,090 B2* | 10/2008 | Mori | H01R 25/003 174/53 |
| 7,497,740 B2* | 3/2009 | Mei | H01R 13/514 200/51 R |
| 7,544,100 B2* | 6/2009 | Teitelbaum | H01R 13/652 439/652 |
| 8,579,641 B1* | 11/2013 | Queru | H01R 24/70 439/224 |
| 8,926,346 B2* | 1/2015 | Hsu | H01R 13/6675 439/143 |
| 2003/0024645 A1* | 2/2003 | Orii | B08B 3/02 156/345.33 |
| 2003/0224645 A1* | 12/2003 | Smith et al. | 439/278 |
| 2006/0258226 A1* | 11/2006 | Milan | H01R 13/506 439/652 |
| 2008/0050951 A1* | 2/2008 | Wu | H01R 13/2442 439/108 |
| 2011/0039435 A1* | 2/2011 | Huang | H01R 27/00 439/218 |
| 2013/0017693 A1* | 1/2013 | Li | H05K 7/1492 439/110 |
| 2013/0017699 A1* | 1/2013 | Li | G06F 1/188 439/212 |
| 2014/0041929 A1 | 2/2014 | Irons et al. | |
| 2014/0302702 A1* | 10/2014 | Germ | H01R 13/02 439/370 |

OTHER PUBLICATIONS

International Preliminary Report on Patentability Corresponding to International Application No. PCT/IB2015/052165; Date of Mailing: Oct. 13, 2016; 8 Pages.

* cited by examiner

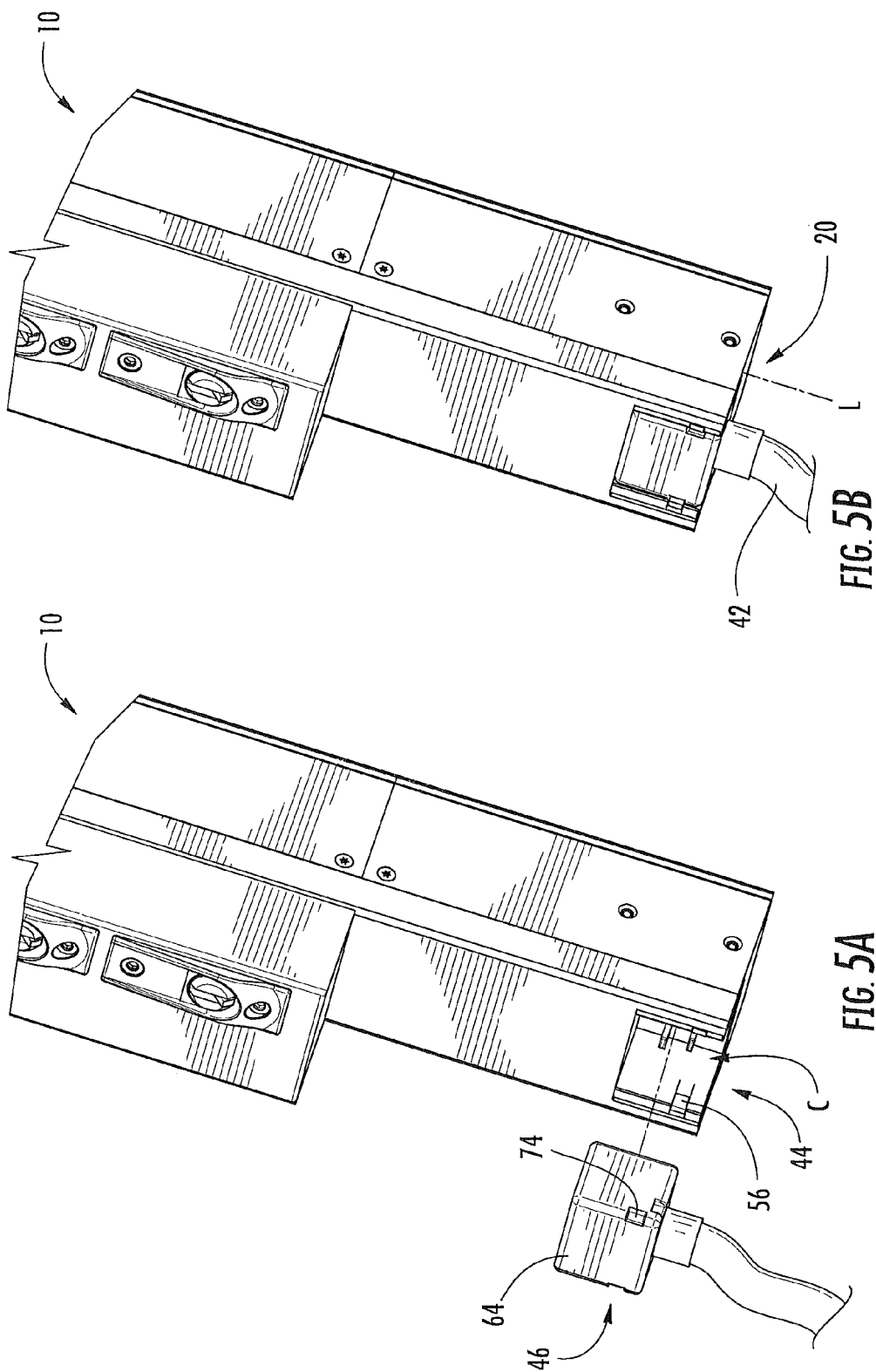

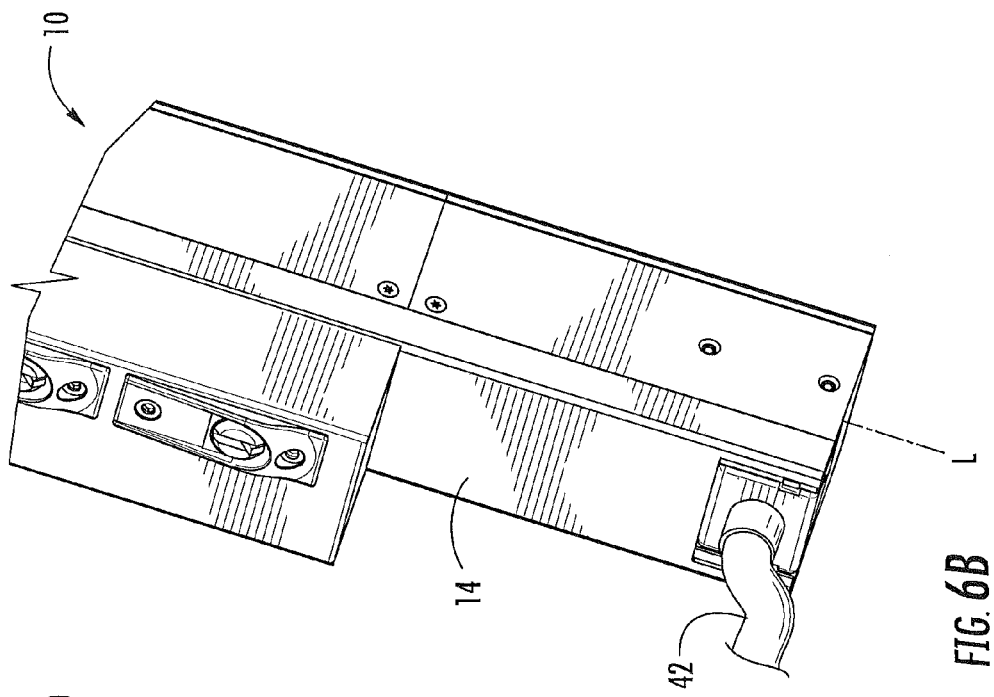
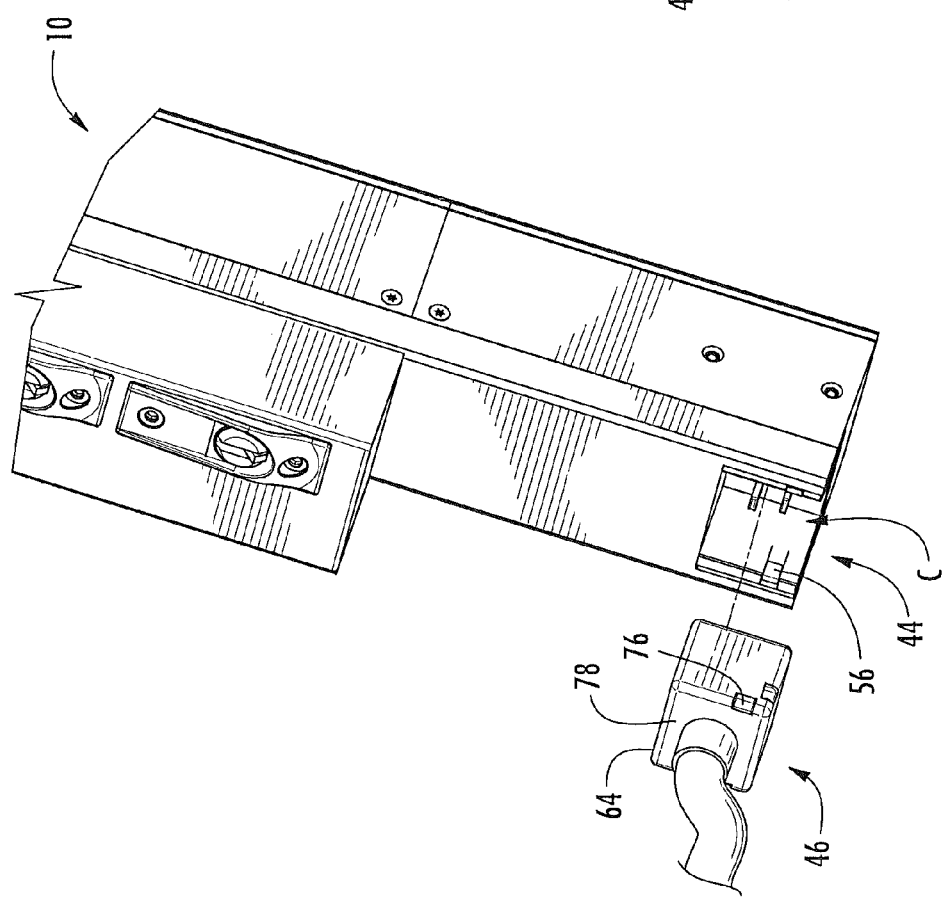

ASSEMBLIES FOR SELECTABLE MOUNTING OF POWER INPUT CABLES AND RELATED SYSTEMS AND METHODS

BACKGROUND

A power input cable for an electrical or electronic device typically can only be connected to the electronic device in a single way such that the power input cable extends away from the electronic device in one particular direction. It would be advantageous in some instances to allow the power input cable to be connected to the electronic device in more than one way such that the power input cable can extend away from the electronic device in more than one direction. For example, for power distribution units mounted in an equipment rack, there may be clearance issues associated with the equipment in the rack and/or with the rack itself. Further, the dedicated power source that connects to the opposite end of the power input cable may be provided in various locations relative to the power distribution unit.

SUMMARY

Some embodiments of the invention are directed to an electrical device assembly. The electrical device assembly includes an electrical device and a power input member. The electrical device includes an end portion having a cavity with a mounting surface at a distal portion of the cavity. The power input member includes a body and a power input cable extending from the body. The body has a plurality of faces including first and second mounting faces. The cavity is sized and configured to receive the power input member body in a first position and in a second position. In the first position, the first mounting face faces the mounting surface and the power input cable extends away from the electrical device in a first direction. In the second position, the second mounting face faces the mounting surface and the power input cable extends away from the electrical device in a second direction that is different from the first direction.

In some embodiments, the electrical device includes a housing defining a longitudinal axis. The first direction may be generally parallel to the longitudinal axis, and the second direction may be generally perpendicular to the longitudinal axis.

In some embodiments, the mounting surface of the electrical device and the first and second mounting faces of the power input member body each include one or more electrical engagement features. In the first position, the electrical engagement features of the first mounting face and the mounting surface may engage one another. In the second position, the electrical engagement features of the second mounting face and the mounting surface may engage one another. In some embodiments, the electrical engagement features of the mounting surface include a plurality of prongs extending from the mounting surface. In some embodiments, the electrical engagement features of the each of the first and second mounting faces include a plurality of receptacles configured to receive the plurality of prongs.

The electrical device may include a pair of locking mechanisms extending into the cavity at a proximal portion of the cavity. The power input member body may include first and second opposing side faces, with each of the first and second side faces including first and second locking mechanisms. In the first position, the locking mechanisms of the electrical device may engage the first locking mechanisms of the power input member body. In the second position, the locking mechanisms of the electrical device may engage the second locking mechanisms of the power input member body. In some embodiments, the locking mechanisms of the electrical device include resilient tabs. The first and second locking mechanisms of the power input member body may include recesses that are sized and configured to receive the tabs.

In some embodiments, the first and second mounting faces are disposed about 90 degrees relative to one another. In some embodiments, the power input cable extends away from a cable face of the power input member body that is opposite the second mounting face of the power input member body.

The electrical device assembly may include an power input receiving member mounted to the end portion of the electrical device and defining the cavity. The power input receiving member may be releasably mounted to the electrical device.

In some embodiments, the electrical device is a power distribution unit (PDU). The PDU may include a front portion having a plurality of outlets. In the first position, the power input cable may extend away from the end portion in the first direction. In the second position, the power input cable may extend away from the front portion in the second direction. In some embodiments, the electrical device assembly is in combination with an equipment rack with the PDU mounted to the rack.

Some other embodiments of the invention are directed to a power input member. The power input member includes a block-shaped body and a power input cable. The body has a plurality of faces including first and second mounting faces and the power input cable is attached to and extends away from the body. The body is sized and configured to be selectably mounted in a cavity of an electrical device in a first position and a second position. In the first position, the first mounting face is at a distal portion of the cavity and the power input cable extends away from the electrical device in a first direction. In the second position, the second mounting face is at the distal portion of the cavity and the power input cable extends away from the electrical device in a second direction that is different than the first direction.

In some embodiments, the power input cable extends away from a cable face of the body that is opposite the second mounting face of the body. In some embodiments, the first and second mounting faces are disposed about 90 degrees relative to one another.

Some other embodiments are directed to a method for mounting a power input cable to an electrical device. The method includes providing a power input member. The power input member includes a block-shaped body having a plurality of faces including first and second mounting faces. The power input member includes a power input cable attached to and extending away from body. The body is sized and configured to be selectably mounted in a cavity of an electrical device in a first position and a second position. In the first position, the first mounting face is at a distal portion of the cavity and the power input cable extends away from the electrical device in a first direction. In the second position, the second mounting face is at the distal portion of the cavity and the power input cable extends away from the electrical device in a second direction that is different than the first direction. The method includes selectably mounting the body of the power input member in the cavity of the electrical device in either the first position or the second position.

In some embodiments, an angle between the first and second directions is about 90 degrees.

Some other embodiments are directed to an electrical device including a housing and a cavity in the housing. The cavity is sized and configured to receive a first power input member such that a power input cable attached to the first power input member extends away from the electrical device in a first direction. The cavity is sized and configured to receive a second power input member such that a power input cable attached to the second power input member extends away from the electrical device in a second direction. An angle between the first and second directions may be about 90 degrees.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

FIG. 5A is a fragmentary top perspective view of the power input member of FIG. 4 positioned over a PDU and ready to be mounted thereto in a first position according to some embodiments.

FIG. 5B is a fragmentary top perspective view of the power input member mounted to the PDU of FIG. 5A in the first position.

FIG. 6A is a fragmentary top perspective view of the power input member of FIG. 4 positioned over a PDU and ready to be mounted thereto in a second position according to some embodiments.

FIG. 6B is a fragmentary top perspective view of the power input member mounted to the PDU of FIG. 6A in the second position.

DETAILED DESCRIPTION OF EMBODIMENTS OF THE INVENTION

Figure 1:
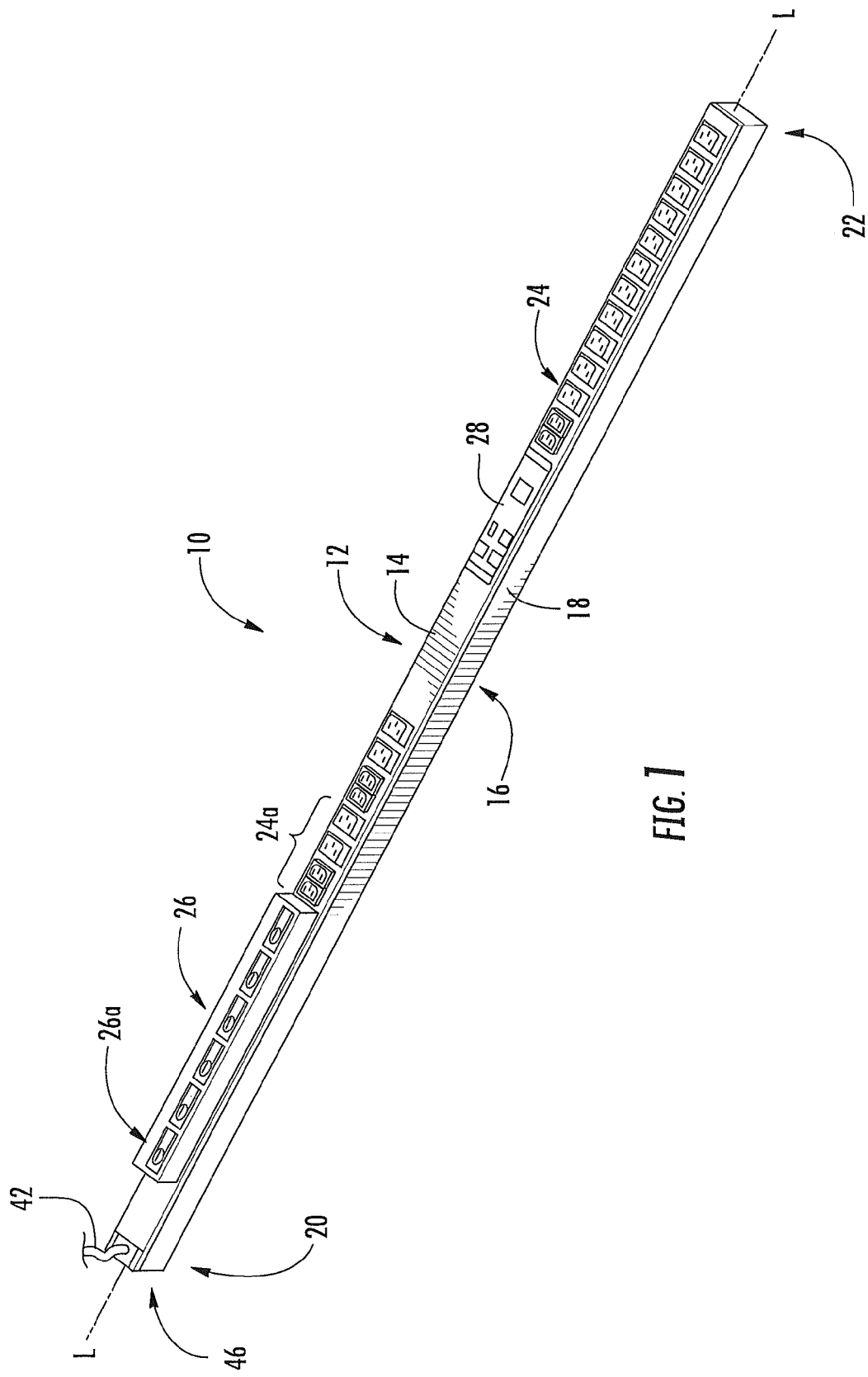
FIG. 1 is a perspective view of a power distribution unit (PDU) with a power input member mounted to the PDU according to some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments, the term "about" when used in connection with a claimed or stated value means within ±10% of the claimed or stated value.

A power distribution unit (PDU) 10 is illustrated in FIG. 1. The PDU 10 has a housing 12. The housing 12 includes a front portion 14 and an opposed back portion 16, opposed side portions 18, and first and second end portions 20, 22.

A plurality of outlets 24 for connecting electronic equipment are provided on the front portion 14 of the housing 12. A plurality of circuit breakers 26 may also be provided on the front portion 14 of the housing 12. The outlets 24 may be grouped into sections and one of the circuit breakers 26 may associated with each section. For example, the circuit breaker 26a may be associated with the section of outlets 24a.

A network management and control module 28 may also be provided on the front portion 14 of the housing 12. The module 28 may include a display device for displaying operational parameters, a user interface device for navigating the display device, and a plurality of connections (e.g., an Ethernet port for connecting to a network, a USB port for firmware upgrades and so forth). These and other features of PDUs are known to those skilled in the art and need not be described in greater detail herein.

As illustrated in FIG. 1, a power input member 46 is mounted at the first end portion 20 of the housing 12. The power input member 46 includes a power input cable or cord 42. When the power input member 46 is connected to the PDU 10, the power input cable 42 extends away from the PDU 10 for connection to a dedicated power source to provide power to the PDU 10 (e.g., to distribute power to the outlets 24). An opposite end of the power input cable 42 includes a plug or the like for connection with the dedicated power source (e.g., a power outlet on a floor, rack, wall, etc.). Therefore, the power input member 46 including the power input cable 42 serves to electrically connect the dedicated power source and the PDU 10.

The PDU housing 12 defines a longitudinal axis L. The longitudinal axis L extends parallel to the side portions 18 of the housing 12 and/or the front and back portions 14, 16 of the housing 12. As described in more detail below, in some embodiments, the power input member 46 is configured such that it can be selectably mounted to the PDU 10 in a first position or way and in a second position or way. In the first position, the power input cable 42 may extend away from the PDU 10 in a direction that is generally parallel to the longitudinal axis L In the second position, the power input cable 42 may extend away from the PDU 10 in a direction that is generally perpendicular to the longitudinal axis L.

Figure 2:
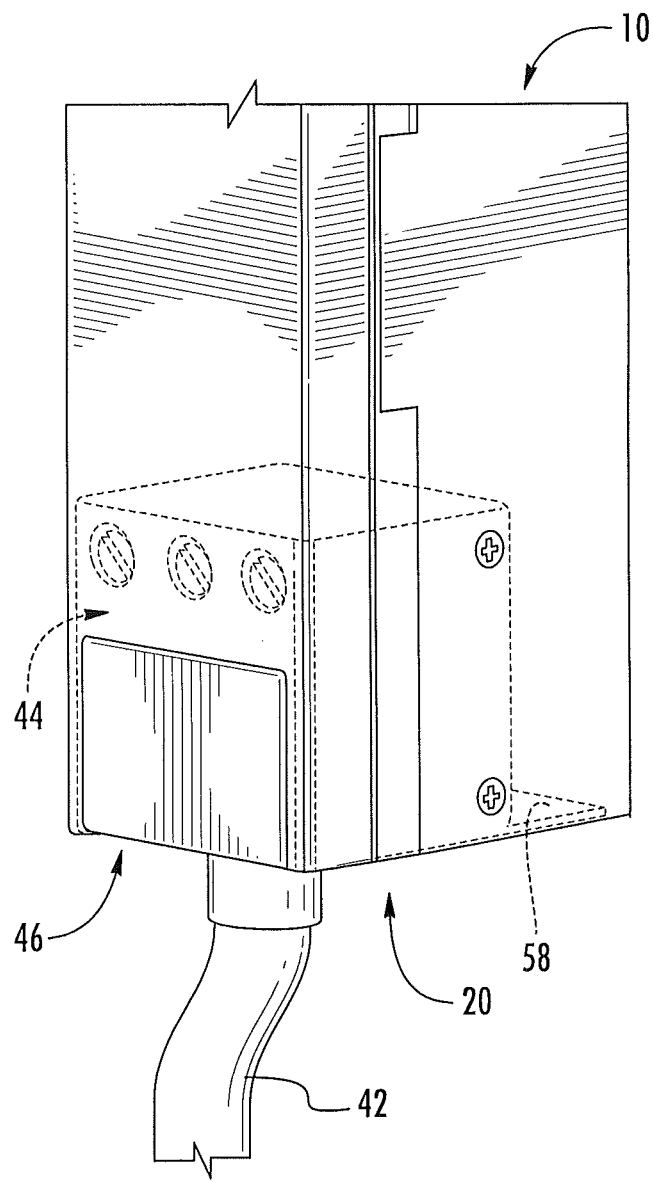
FIG. 2 is a fragmentary perspective view of the PDU and power input member of FIG. 1.

The power input member 46 mounted to the PDU 10 is illustrated in greater detail in FIG. 2. As illustrated in FIG. 2, a power input receiving member 44 is mounted to the end portion 20 of the PDU 10. The power input member 46 is matingly received in the power input receiving member 44.

Figure 3:
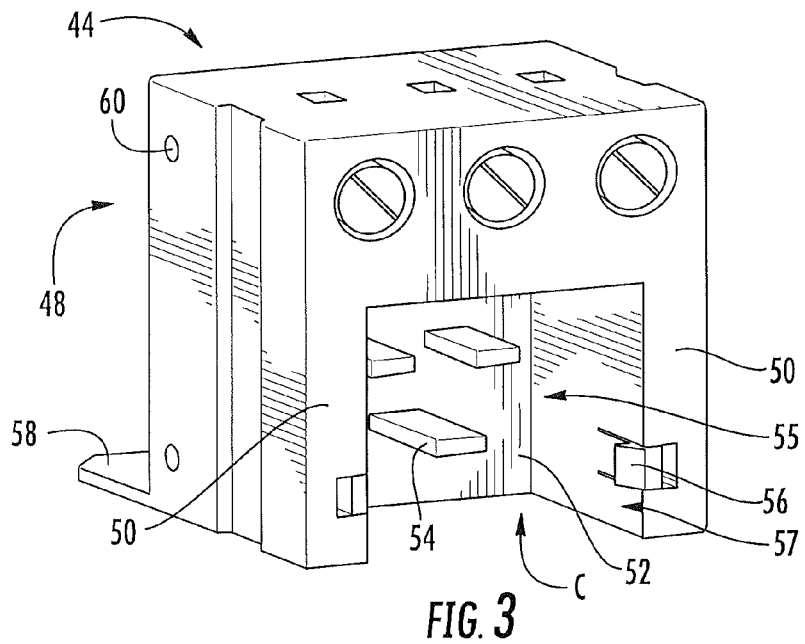
FIG. 3 is a perspective view of a power input receiving member according to some embodiments.

Referring now to FIG. 3, the power input receiving member 44 has a body 48. The body 48 includes sidewalls 50 and a mounting surface or wall 52 that define a cavity C. The mounting surface 52 is disposed at a distal portion 55 of the cavity C. Extending from the mounting surface 52 and into the cavity C are a plurality of prongs 54. Extending from each of the sidewalls 50 is a tab 56 that projects slightly into the cavity C at a proximal portion 57 thereof. The tabs 56 may be deformable and/or resilient.

The power input receiving member 44 as illustrated also includes a flange 58 and apertures 60 on each side of the body 48. Turning back to FIG. 2, the apertures 60 may be aligned with corresponding apertures of the PDU 10 to mount the power input receiving member 44 to the first end portion 20 of the PDU 10. The flange 58 may serve to enclose the PDU 10 at the first end portion 20. It will be understood that other configurations are contemplated. For example, the power input receiving member 44 may be integrally formed with the housing 12 of the PDU 10. In this regard, the PDU housing 12 may define the cavity C in the manner described above in connection with the power input receiving member 44.

Figure 4:
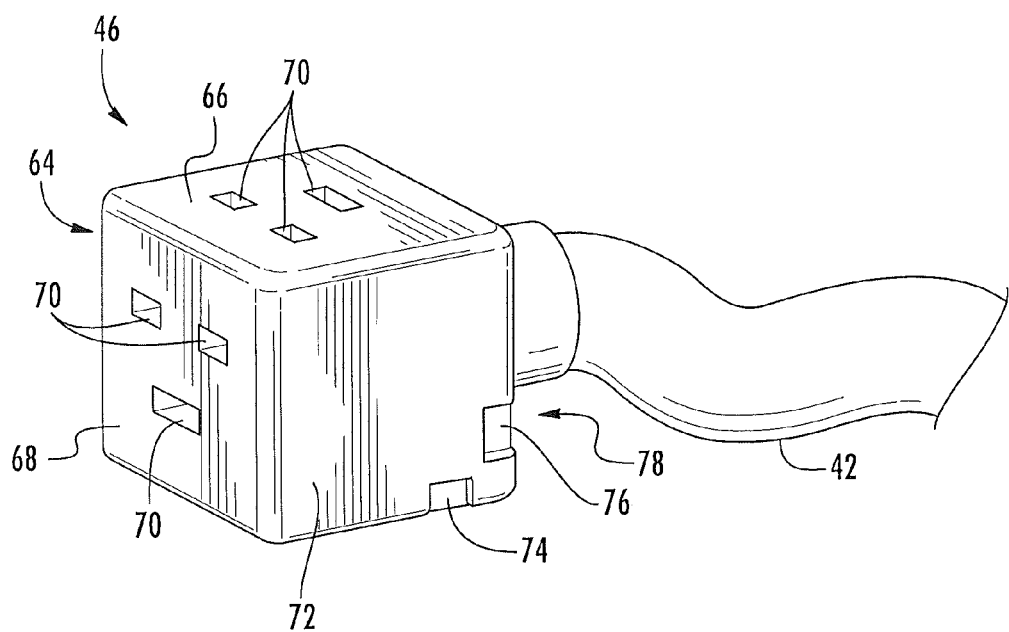
FIG. 4 is a perspective view of a power input member according to some embodiments.

Referring now to FIG. 4, the power input member 46 has a body 64. In some embodiments, and as illustrated, the body 64 is block-shaped. The cavity C of the power input receiving member 44 and the body 64 of the power input member 46 are sized and configured such that the body 64 may be received in the cavity C as described in greater detail below. The body 64 includes a first mounting face 66 and a second mounting face 68. Each of the first and second mounting faces 66, 68 includes a plurality of receptacles 70. The receptacles 70 are sized and configured to receive the prongs 54 of the power input member 44 to electrically connect the power input cable 42 and the PDU 10.

The power input cable 42 extends away from a cable face 78 of the body 64. The cable face 78 is opposite the second mounting face 68 of the body 64. In some embodiments, a proximal portion of the power input cable 42 at the cable face 78 has increased rigidity relative to other distal portions of the power input cable 42. The "distal portions" may include the remainder of the length of the power input cable 42 or at least a major portion of the remainder of the length of the power input cable 42. This increased rigidity may help ensure that the power input cable 42 extends away from the cable face 78 in the appropriate direction (e.g., in a direction that is perpendicular to the cable face 78). The proximal portion of the power input cable 42 may have greater diameter or thickness relative to the distal portions of the power input cable 42 to provide the increased rigidity at the proximal portion. The power input cable 42 may include a sleeve or the like around the power input cable 42 at the proximal portion to provide the increased rigidity.

Although the illustrated embodiment shows the power input receiving member 44 including prongs 54 and the power input member 46 including receptacles 70, it will be appreciated that other configurations are contemplated. For example, the power input receiving member 44 may include receptacles and the input member 46 may include prongs. Generally speaking, the mounting surface 52 (FIG. 3) includes one or more electrical engagement features and each of the first and second mounting faces 66, 68 (FIG. 4) includes one or more electrical engagement features.

The power input member 46 has a pair of opposed side faces 72 (only one of which is visible in FIG. 4). Each side face 72 includes first and second recesses 74, 76. The tabs 56 of the power input receiving member 44 may be received in the one of the first and second pair of recesses 74, 76 when the body 64 is received in the cavity C (FIG. 3).

Figure 5C:
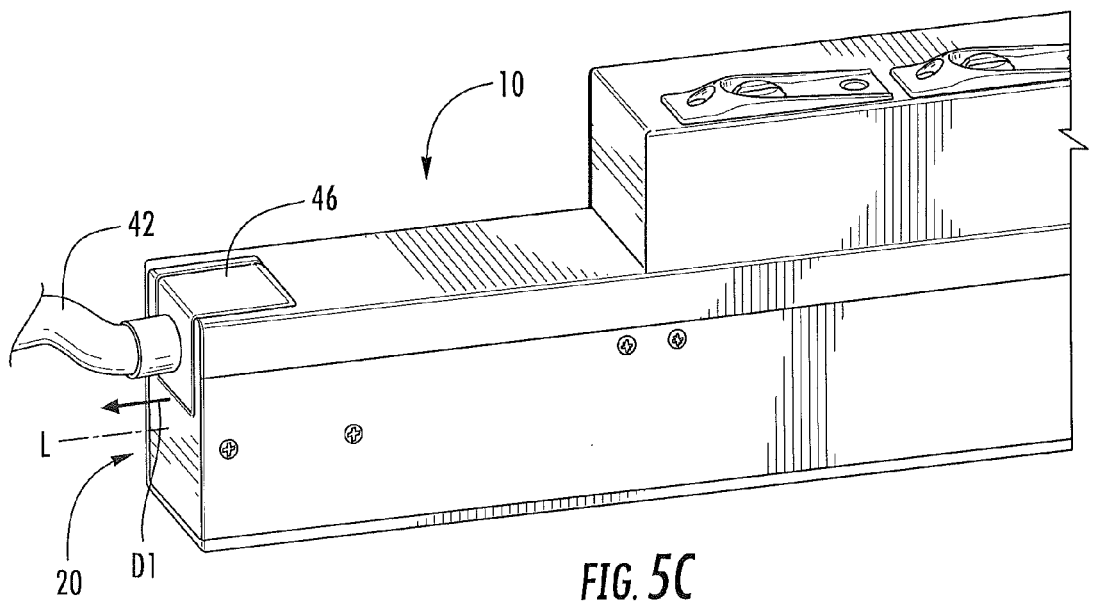
FIG. 5C is a fragmentary side perspective view of the power input member mounted to the PDU of FIG. 5A in the first position.

Turning now to FIGS. 5 and 6, the body 64 of the power input member 46 is inserted into the cavity C in two different positions or ways such that the power input cable 42 extends away from the PDU 10 in two different directions. As shown in FIGS. 5A-5C, the body 64 of the power input member 46 can be received in the cavity C of the power input receiving member 44 in a first orientation or position. In the first position, the first mounting face 66 of the body 64 faces the mounting surface 52 at the distal end portion of the cavity C (FIGS. 3 and 4). In the illustrated embodiment, the prongs 54 in the cavity C are received in the receptacles 70 of the first mounting face 66 of the body 64 (FIGS. 3 and 4). Where used, the tabs 56 are received in the first recesses 74 of the body 64 and may lockingly engage with the first recesses 74. The power input cable 42 extends away from the first end portion 20 of the PDU 10. Put another way, the power input cable 42 extends away form the PDU 10 in a first direction D1 that is generally parallel to the longitudinal axis L (FIG. 5C).

Figure 6C:
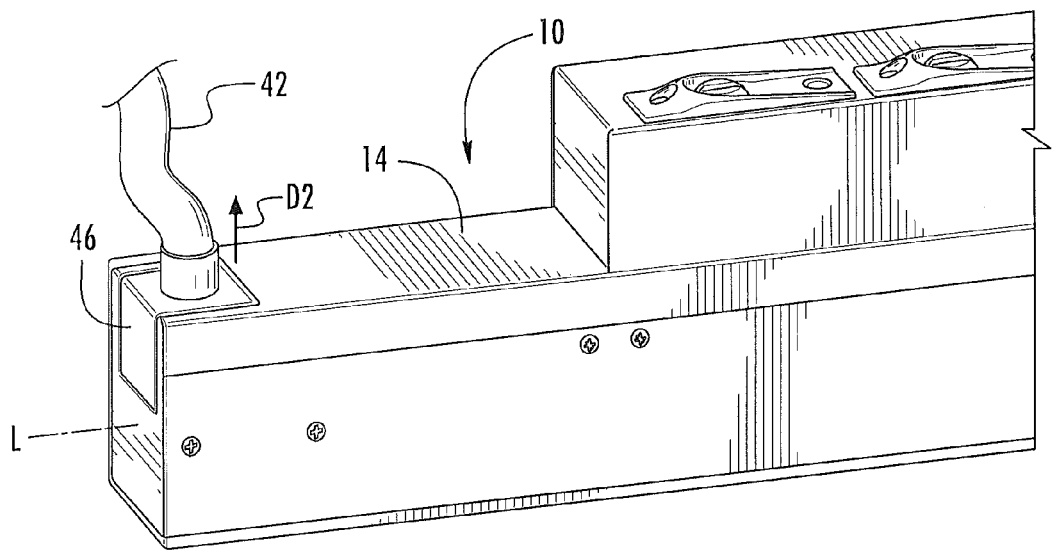
FIG. 6C is a fragmentary side perspective view of the power input member mounted to the PDU of FIG. 6A in the second position.

Referring to FIGS. 6A-6C, the body 64 of the power input member 46 can be received in the cavity C in a second orientation or position. In the second position, the second mounting face 68 of the body 64 faces the mounting surface 52 at the distal end portion of the cavity C (FIGS. 3 and 4). In the illustrated embodiment, the prongs 54 in the cavity C are received in the receptacles 70 of the second mounting face 68 of the body 64 (FIGS. 3 and 4). Where used, the tabs 56 are received in the second recesses 76 of the body 64 may lockingly engage with the second recesses 76. The power input cable 42 extends away from the front face 14 of the PDU 10. Put another way, the power input cable 42 extends away form the PDU 10 in a second direction D2 that is generally perpendicular to the longitudinal axis L (FIG. 6C).

In some embodiments, an angle between the first and second directions D1, D2 is about 90 degrees. In some embodiments, the first and second mounting faces 66, 68 (FIG. 4) are disposed about 90 degrees relative to one another. These configurations allow for a user to account for clearance issues or varying dedicated power source locations by selecting between the first and second mounting positions such that the power input cable 42 extends away from the PDU 10 in a direction that best suits the environment.

Figure 7A:
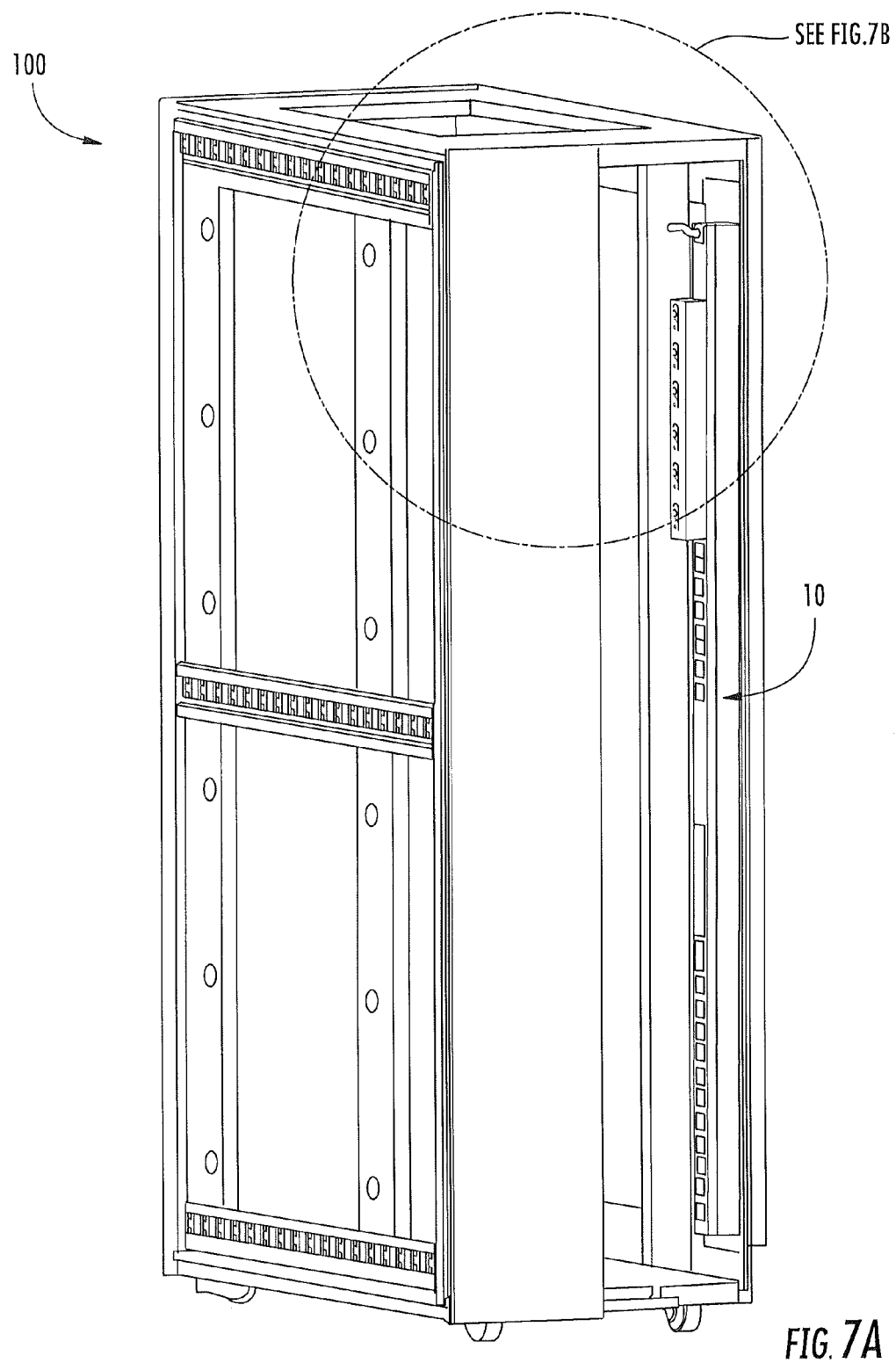
FIG. 7A is a perspective view of an equipment rack with a PDU mounted thereto according to some embodiments.
Figure 7B:
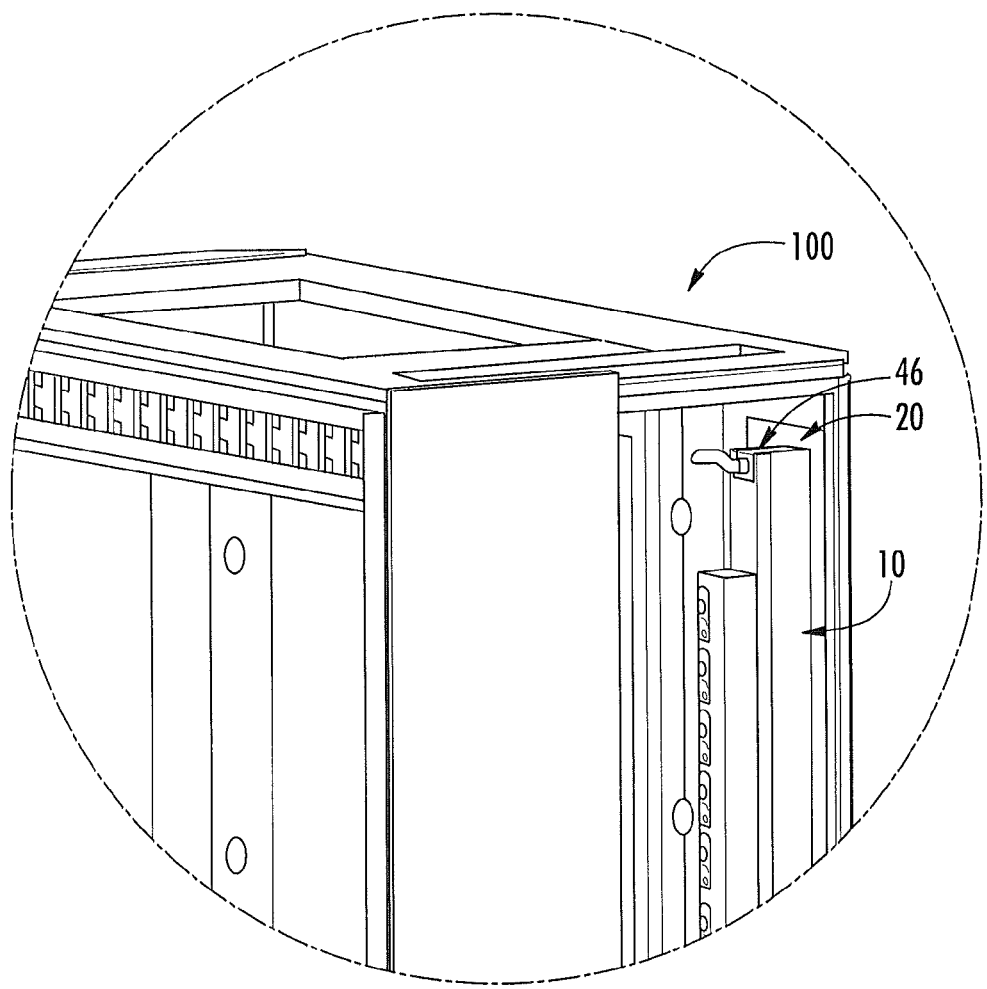
FIG. 7B is an enlarged fragmentary perspective view of the area indicated in FIG. 7A.

The ability to mount the receptacle member in different ways such that the power input cable extends away from the PDU 10 in different directions may be particularly useful when the PDU 10 is mounted in a cabinet, enclosure or rack. FIGS. 7A and 7B show the PDU 10 mounted to an equipment rack 100. The equipment rack 100 may contain equipment that can cause cable management or clearance issues, and embodiments of the invention allow a user to select the most appropriate direction that the power input cable 42 extends away from the PDU 10. The rack itself may also cause clearance issues, for example when the PDU is mounted such that the end portion 20 is at or near a corner and/or a top of the rack 100.

Although PDUs have been discussed herein, it will be appreciated that embodiments of the invention may be advantageously employed with any electrical or electronic device requiring a corded connection. Further, although a power input cable having two mounting faces with electrical engagement features has been discussed herein, it will be appreciated that the cavity defined by the power input receiving member and/or the housing of the device (e.g., PDU) may be sized and configured to receive different power input members such that power input cables associated therewith extend away from the device in different directions. For example, the power input member 46 shown in FIG. 4 may include the first mounting face 66 having the electrical engagement features (e.g., receptacles 70) but not the second mounting face 68 having the electrical engagement features (e.g., receptacles 70). Similarly, the power input member 46 may include the second mounting face 68 having the electrical engagement features (e.g., receptacles 70) but not the first mounting face 66 having the electrical engagement features (e.g., receptacles 70). In this regard, different power input members can be received in the cavity such that the power input cable associated therewith extends away from the device in different directions.

Embodiments of the present invention provide an elegant and robust solution to allow a power input cable to be selectively mounted to an electrical or electronic device such that the power input cable extends away from the electronic device in a selected direction. The assemblies described herein allow for the power input cable to be securely mounted to the device and are without additional mechanical components (e.g., rotational members) that may be prone to fail and/or may not securely hold the power input cable in its desired orientation. The assemblies described herein can also allow for a power input member that can be relatively easily removed (e.g., without tools) and the same or different power input member can be installed to change the direction of the power input cable.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. An electrical device assembly comprising:
an electrical device including an elongated housing defining a longitudinal axis, the housing including a front portion and first and second opposite end portions, the first end portion having a cavity bounded by first and second opposite sidewalls with a mounting surface at a distal portion of the cavity;
a power input member including a body and a power input cable attached to and extending from the body, the body having a plurality of faces including first and second mounting faces, first and second opposite side faces, and a cable face from which the power input cable extends;
wherein the cavity is sized and configured to receive the power input member body:
in a first position with the first mounting face facing the mounting surface, with the first and second side faces facing the first and second sidewalls, respectively, with the cable face facing generally parallel to the longitudinal axis, and with the power input cable extending away from the electrical device in a first direction that is generally parallel to the longitudinal axis; and
in a second position with the second mounting face facing the mounting surface, with the first and second side faces facing the first and second sidewalls, respectively, with the cable face facing generally perpendicular to the longitudinal axis, and with the power input cable extending away from the electrical device in a second direction that is generally perpendicular to the longitudinal axis.

2. The electrical device assembly of claim 1, wherein the mounting surface of the electrical device and the first and second mounting faces of the power input member body each includes one or more electrical engagement features.

3. The electrical device assembly of claim 2, wherein:
in the first position, the electrical engagement features of the first mounting face and the mounting surface engage one another; and
in the second position, the electrical engagement features of the second mounting face and the mounting surface engage one another.

4. The electrical device assembly of claim 2, wherein the electrical engagement features of the mounting surface comprise a plurality of prongs extending from the mounting surface, and wherein the electrical engagement features of the each of the first and second mounting faces comprise a plurality of receptacles configured to receive the plurality of prongs.

5. The electrical device assembly of claim 1, wherein the electrical device includes a pair of locking mechanisms extending into the cavity at a proximal portion of the cavity, wherein each of the first and second side faces of the power input member body includes first and second locking mechanisms, and wherein:
 in the first position, the locking mechanisms of the electrical device engage the first locking mechanisms of the power input member body; and
 in the second position, the locking mechanisms of the electrical device engage the second locking mechanisms of the power input member body.

6. The electrical device assembly of claim 5, wherein the locking mechanisms of the electrical device comprise resilient tabs, and wherein the first and second locking mechanisms of the power input member body comprise recesses that are sized and configured to receive the tabs.

7. The electrical device assembly of claim 1, wherein the first and second mounting faces are disposed about 90 degrees relative to one another.

8. The electrical device assembly of claim 1, wherein the cable face of the power input member body is opposite the second mounting face of the power input member body.

9. The electrical device assembly of claim 1, further comprising a power input receiving member mounted to the first end portion of the electrical device and defining the cavity.

10. The electrical device assembly of claim 9, wherein the power input receiving member is releasably mounted to the electrical device.

11. The electrical device assembly of claim 1, wherein the electrical device is a power distribution unit (PDU).

12. The electrical device assembly of claim 11, wherein the PDU front portion includes a plurality of outlets, and wherein:
 in the first position, the power input cable extends away from the end portion in the first direction; and
 in the second position, the power input cable extends away from the front portion in the second direction.

13. The electrical device assembly of claim 11 in combination with an equipment rack with the PDU mounted to the rack.

14. The electrical device assembly of claim 5, wherein:
 the first locking mechanism of the first side face is at an interface between the first side face and a face opposite the first mounting face;
 the second locking mechanism of the first side face is at an interface between the first side face and the cable face;
 the first locking mechanism of the second side face is at an interface between the second side face and the face opposite the first mounting face; and
 the second locking mechanism of the second side face is at an interface between the second side face and the cable face.

15. A power input member comprising:
 a block-shaped body having a plurality of faces including first and second mounting faces; and
 a power input cable attached to and extending away from the body;
 wherein the body is sized and configured to be selectably mounted in a cavity of an electrical device comprising an elongated housing including an end portion having the cavity with a mounting surface at a distal portion of the cavity: (i) in a first position with the first mounting face facing the mounting surface at the distal portion of the cavity and the power input cable extending away from the electrical device in a first direction; and (ii) in a second position with the second mounting face facing the mounting surface at the distal portion of the cavity and the power input cable extending away from the electrical device in a second direction that is different than the first direction.

16. The power input member of claim 15, wherein the power input cable is attached to and extends away from a cable face of the body that is opposite the second mounting face of the body.

17. The power input member of claim 16, wherein the first and second mounting faces are disposed about 90 degrees relative to one another.

18. A method for mounting a power input cable to an electrical device, the method comprising:
 providing a power input member comprising:
  a single-piece block-shaped body having a plurality of faces including first and second mounting faces; and
  a power input cable attached to and extending away from body;
 providing an electrical device comprising an elongated housing including an end portion having a cavity with a mounting surface at a distal portion of the cavity, wherein the cavity is sized and configured so that the power input member body can be selectably mounted in the cavity in a first position with the first mounting face facing the mounting surface at the distal portion of the cavity and the power input cable extending away from the electrical device in a first direction and in a second position with the second mounting face facing the mounting surface at the distal portion of the cavity and the power input cable extending away from the electrical device in a second direction that is different than the first direction; and
 selectably mounting the body of the power input member in the cavity of the electrical device in either the first position or the second position.

19. The method of claim 18, wherein an angle between the first and second directions is about 90 degrees.

20. An electrical device comprising:
 an elongated housing comprising a front and first and second opposite ends; and
 a cavity at the first end of the housing and bounded by first and second opposite sidewalls;
 wherein the cavity is sized and configured to:
  receive a first power input member having a body with first and second opposite side faces of the first power input member body facing the first and second sidewalls, respectively, and with a cable face of the first power input member body substantially flush with the first end of the housing such that a power input cable attached to the first power input member body and extending from a cable face of the first power input member body extends away from the electrical device in a first direction; and
  receive a second power input member having a body with first and second opposite side faces of the second power input member body facing the first and second sidewalls, respectively, and with a cable face of the second power input member body substantially flush with the front of the housing such that a power input cable attached to the second power input member body and extending from a cable face of the second power input member body extends away from the electrical device in a second direction, wherein an angle between the first and second directions is about 90 degrees.

* * * * *